(12) United States Patent
Saito et al.

(10) Patent No.: US 7,998,794 B2
(45) Date of Patent: Aug. 16, 2011

(54) RESIN MOLDED SEMICONDUCTOR DEVICE AND MANUFACTURING METHOD THEREOF

(75) Inventors: Kiyoshi Saito, Ota (JP); Yuji Umetani, Gunma (JP); Hideaki Yoshimi, Gunma (JP)

(73) Assignees: Sanyo Electric Co., Ltd., Moriguchi-shi (JP); Sanyo Semiconductor Co., Ltd., Ora-gun (JP)

( * ) Notice: Subject to any disclaimer, the term of this patent is extended or adjusted under 35 U.S.C. 154(b) by 135 days.

(21) Appl. No.: 12/539,939

(22) Filed: Aug. 12, 2009

(65) Prior Publication Data
US 2010/0052138 A1    Mar. 4, 2010

(30) Foreign Application Priority Data
Aug. 29, 2008   (JP) .................................. 2008-220982

(51) Int. Cl.
*H01L 21/00* (2006.01)
(52) U.S. Cl. ................. 438/123; 438/124; 257/E21.504
(58) Field of Classification Search .................. 438/123, 438/124, 127
See application file for complete search history.

(56) References Cited

U.S. PATENT DOCUMENTS

| 4,942,455 A * | 7/1990 | Shinohara | 257/666 |
| 2008/0191328 A1 * | 8/2008 | Kobayakawa | 257/676 |

OTHER PUBLICATIONS

Handotai Shingijutsu Kenkyukai ed. (2007) "Function and aim of semiconductor package" in *All About Leading Edge Packaging Technologies—With Illustrations*. Kogyo Chosakai Publishing Co., Ltd. (3 pages).

* cited by examiner

*Primary Examiner* — Phat X Cao
*Assistant Examiner* — Nga Doan
(74) *Attorney, Agent, or Firm* — Morrison & Foerster LLP

(57) ABSTRACT

This invention is directed to provide a method of manufacturing a resin molded semiconductor device with high reliability by preventing a resin leakage portion from occurring due to burrs on a lead frame formed by punching. The method of manufacturing the resin molded semiconductor device according to the invention includes bonding a semiconductor die on an island in a lead frame, electrically connecting the semiconductor die with the lead frame, resin-molding the lead frame on which the semiconductor die is bonded, and applying prior to the resin-molding a compressive pressure that is higher than a clamping pressure applied in the resin-molding to a region of the lead frame being clamped by molds in the resin-molding of the lead frame.

2 Claims, 6 Drawing Sheets

RESIN MOLDED SEMICONDUCTOR DEVICE AND MANUFACTURING METHOD THEREOF

CROSS-REFERENCE OF THE INVENTION

This application claims priority from Japanese Patent Application No. 2008-220982, the content of which is incorporated herein by reference in its entirety.

BACKGROUND OF THE INVENTION

1. Field of the Invention

This invention relates to a resin molded semiconductor device and its manufacturing method.

2. Description of the Related Art

To manufacture a resin molded semiconductor device, a lead frame is prepared, each of various kinds of semiconductor dice, a passive element or the like is die-bonded to the lead frame with solder, silver paste or the like, the semiconductor die or the like and the lead frame are electrically connected by wire-bonding or the like through an aluminum wire or a gold wire, and then the semiconductor device is completed by resin-molding the lead frame excluding outer lead portions, followed by cutting a tie bar and folding the leads or the like as required.

The assembly process of the resin molded semiconductor device as mentioned above is described, for example in "All about Leading Edge Packaging Technologies—with Illustrations" edited by Handotai Shingijutsu Kenkyukai, Sep. 25, 2007, published by Kogyo Chosakai Publishing Co., Ltd.

In the assembly process of the resin molded semiconductor device as described above, an unnecessary resin film 104 is inevitably formed in a region surrounded by a resin package 101 that is filled with the resin, outer leads 102 and a tie bar 103 as shown in FIG. 4 at a completion of a resin-molding process step, as a result of the resin molding method. However, a resin leakage portion 105 as shown in FIG. 4 is usually not formed on a surface of the tie bar 103 or the outer lead 102. It is because resin injection in the resin-molding is carried out while an upper mold 115 and a lower mold 106 apply a high pressure to a lead frame 107 which bears a semiconductor die 108 bonded thereon and electrically connected with the semiconductor die 108 through a bonding wire 110 or the like as shown in FIG. 5 so that the resin does not leak.

In this case, the tie bar 103, which is formed between the outer leads 102 and serves to hold the outer leads 102 until the resin-molding process step is completed, also serves as a dam bar 109 as shown in FIG. 5 and FIG. 6 to block and prevent the injected resin from leaking out of the resin package 101. Therefore, the injected resin neither leaks out of the dam bar 109 nor forms the resin leakage portion 105 on the surface of the tie bar 103 or the outer lead 102 outside the resin package 101, although the injected resin forms the unnecessary resin film 104 in the region surrounded by the resin package 101, the outer leads 102 and the dam bar 109, i.e. the tie bar 103.

However, what is stated above holds true only when the surfaces of the lead frame 107 have flatness and are firmly and tightly pressed against the upper mold 115 and the lower mold 106 in the resin-molding process step. In reality, however, the lead frame 107 that is formed by punching has burrs 111 consisting of fine projections and depressions on its surface as shown in FIG. 7B that is an enlarged view of a portion marked with a dashed line circle in FIG. 7A. Thus there are caused very narrow gaps between the lead frame and the mold in some cases, even when the lead frame 107 is pressed by the upper mold 115 and the lower mold 106 from above and below. As a result, the resin leaks through the gaps to form the resin leakage portion 105 made of thin resin film on the surfaces of the tie bar 103 and the outer leads 102 as shown in FIG. 4. The resin leakage portion 105 flakes off in a subsequent process step such as folding the leads to make dust that causes problems in yield and reliability.

It should be noted that the resin film 104 formed in the region surrounded by the resin package 101, the outer leads 102 and the tie bar 103 can be relatively easily removed by sandblasting, air showering or the like and that the resin leakage portion 105 sticking firmly to the outer leads 102 and the like can be not easily removed by the means mentioned above.

SUMMARY OF THE INVENTION

The invention provides a method of manufacturing a resin molded semiconductor device. The method includes providing a lead frame comprising an island, bonding a semiconductor die on the island of the lead frame, electrically connecting the semiconductor die to the lead frame, resin-molding the lead frame on which the semiconductor die is bonded while clamping the lead frame with a mold so as to apply a clamping pressure to a region of the lead frame, and applying a compressive pressure to the region of the lead frame prior to the resin-molding. The compressive pressure being greater than the clamping pressure.

The invention also provides a resin molded semiconductor device that includes a lead frame, a semiconductor die bonded to the lead frame and electrically connected to the lead frame, and a resin package housing the lead frame and the semiconductor die. The lead frame including a dent portion extending from inside the resin package to outside the resin package, and the surface roughness of the dent portion is smaller than the surface roughness of the lead frame not having the dent portion.

DETAILED DESCRIPTION OF THE INVENTION

Figure 1A:
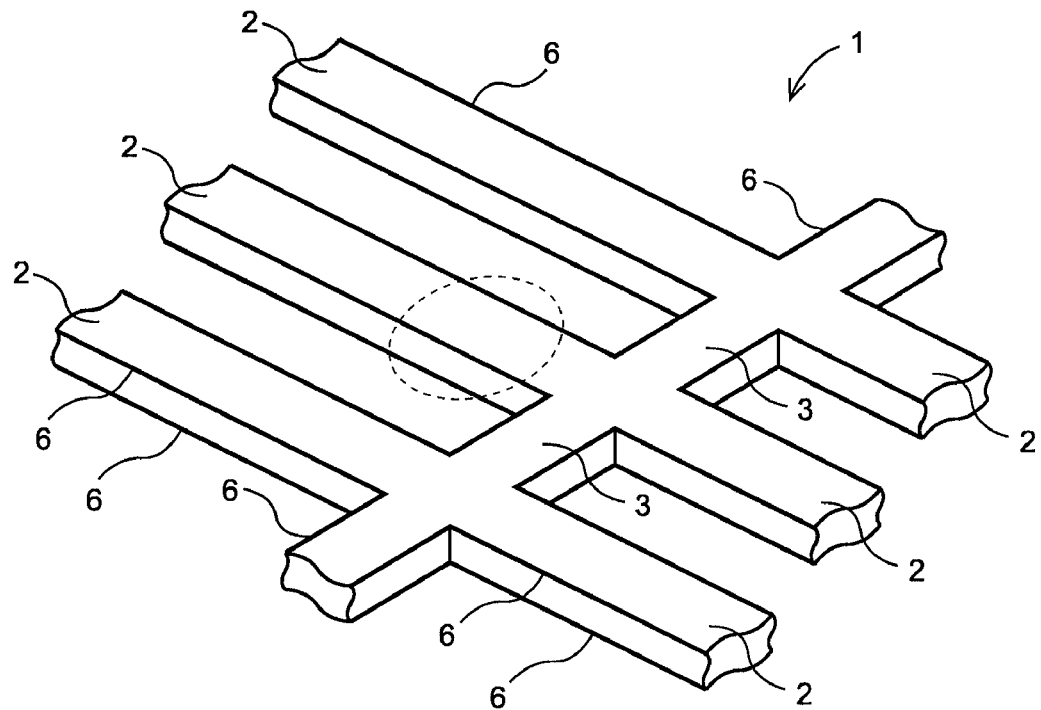
FIGS. 1A and 1B are oblique perspective figures showing a lead frame after burrs on the lead frame are flattened by a method of manufacturing a resin molded semiconductor device according to an embodiment of this invention.

An embodiment of this invention is hereafter described referring to the drawings.

A portion of an SIP (Single In-line Package) is shown in the drawings and described since it is sufficient for understanding features of this invention that an outer leads 2 exposed out of a resin package 5, a tie bar 3 and a lower edge of the resin package 5 are shown and explained.

Figure 7A:
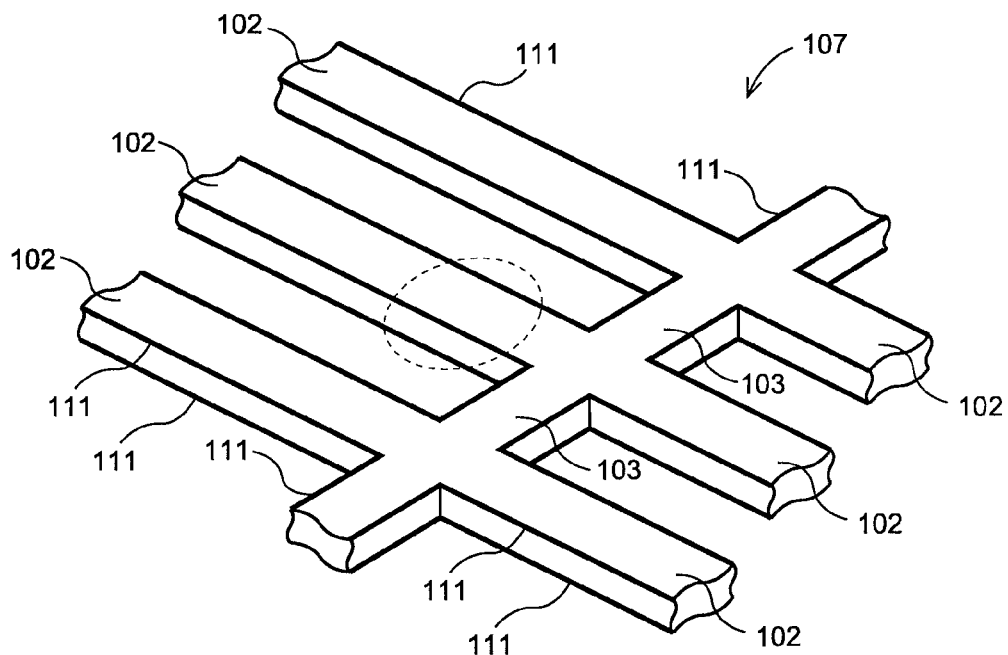
FIGS. 7A and 7B are oblique perspective figures showing the burrs on the lead frame formed by punching.
Figure 7B:
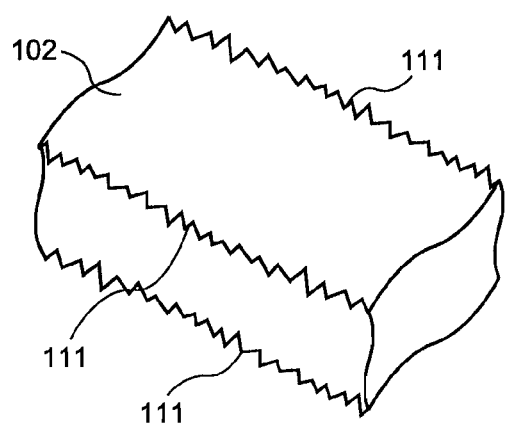

An embodiment of this invention is explained referring to FIGS. 1A, 1B, 2A and 2B. First, there is provided a lead frame 1 as shown in FIG. 1A, which is identical to the lead frame 107 described above and shown in FIG. 7A. The lead frame 1 has burrs consisting of fine projections and depressions on its surface derived from punching, which are identical to the burrs 111 as shown in FIG. 7B. Thus, the resin leakage portion 105 would be caused as in the prior art, if the resin-molding is performed without any countermeasures.

Because the projections and depression of the burrs 11 are very fine, they are flattened by the clamping pressure of the mold and cause no problem even when the resin-molding is performed without any countermeasures. In some cases, however, the resin leakage portion 105 is formed due to variations in the projections and depressions of the burrs 111, variations in the clamping pressure of the mold in the resin-molding process step, a lack of clamping pressure when a mold for a single row frame is used in place of a mold for a triple row frame or the like.

Figure 3A:
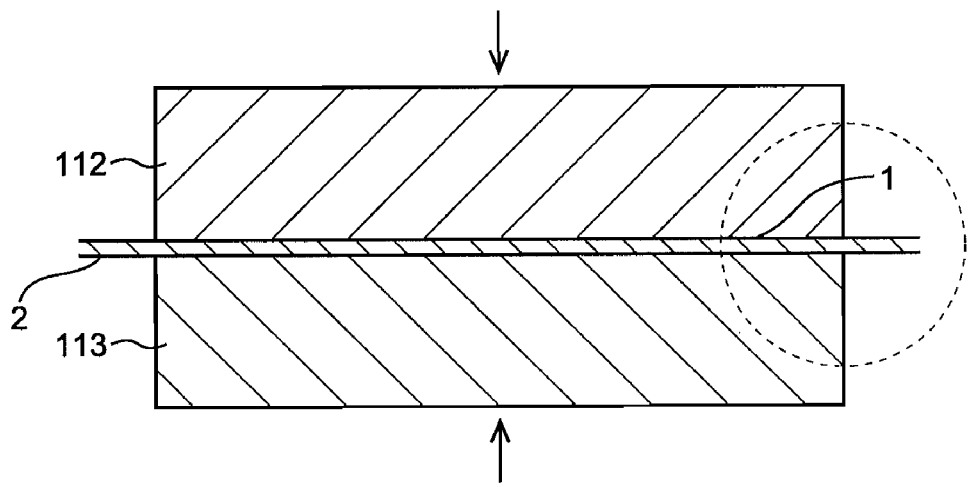
FIGS. 3A and 3B are cross-sectional views showing a process step of applying a compressive pressure to flatten the burrs on the lead frame in the method of manufacturing the resin molded semiconductor device according to the embodiment of this invention.

A feature of this invention is that the resin leakage portion 105 is prevented from occurring by flattening prior to the resin-molding process step the projections and depressions of the burrs on the lead frame 1, which are identical to the burrs 111 as shown in FIG. 7B. There is introduced a process step to apply a compressive pressure to the lead frame 1, as shown in FIG. 3A. The process step is usually performed before a semiconductor die 9 is bonded to the lead frame 1. In the process step to apply the compressive pressure, the compressive pressure that is larger than the clamping pressure applied in the resin-molding process step is applied in directions indicated by upward and downward arrows in FIG. 3A to a region larger than a region of the lead frame 1 including the tie bar 3 to which the clamping pressure is applied by the mold in the resin-molding process step.

Figure 1B:
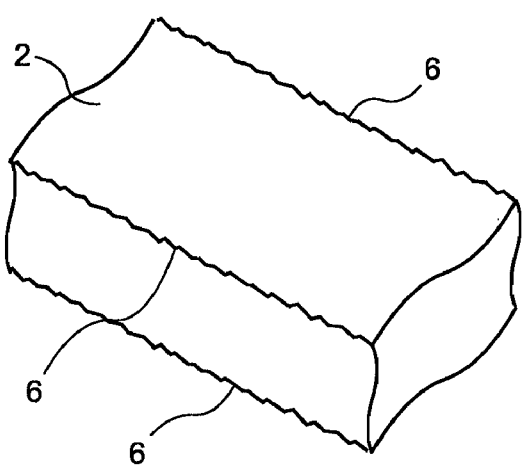

The burrs on the lead frame 1 caused by the punching, which are identical to the burrs 111 consisting of the projections and depressions as shown in FIG. 7B, are flattened as shown in FIG. 1B, that is an enlarged view of a portion marked with a dashed line circle in FIG. 1A, by applying the compressive pressure. As a result, the burrs in the region to which the clamping pressure is to be applied by the molds in the resin-molding process step are turned into flattened burrs 6. After that, the semiconductor die 9 is bonded to the lead frame 1 and electrically connected with the lead frame 1 through a bonding wire 10 before the resin-molding is performed.

Figure 2A:
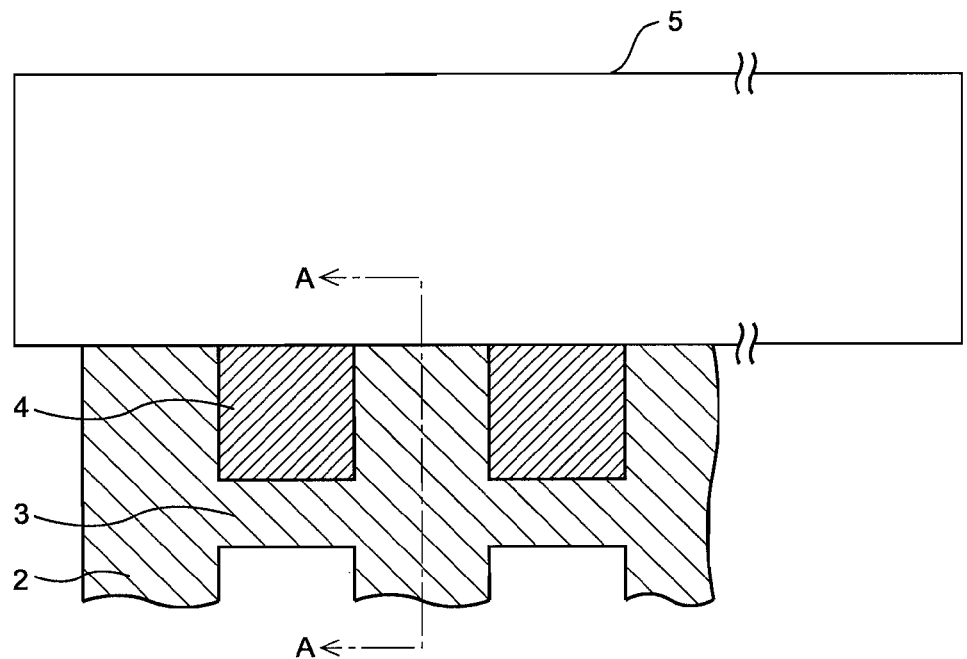
FIG. 2A is a plan view showing the method of manufacturing the resin molded semiconductor device according the embodiment of this invention.
Figure 4:
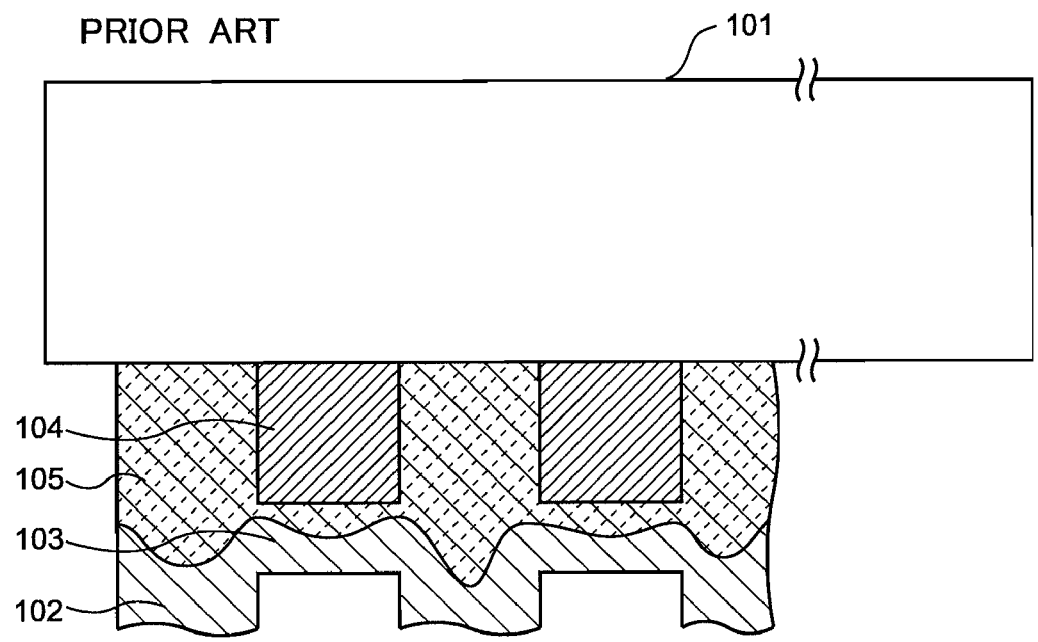
FIG. 4 is a plan view showing a method of manufacturing a resin molded semiconductor device according a prior art.
Figure 5:
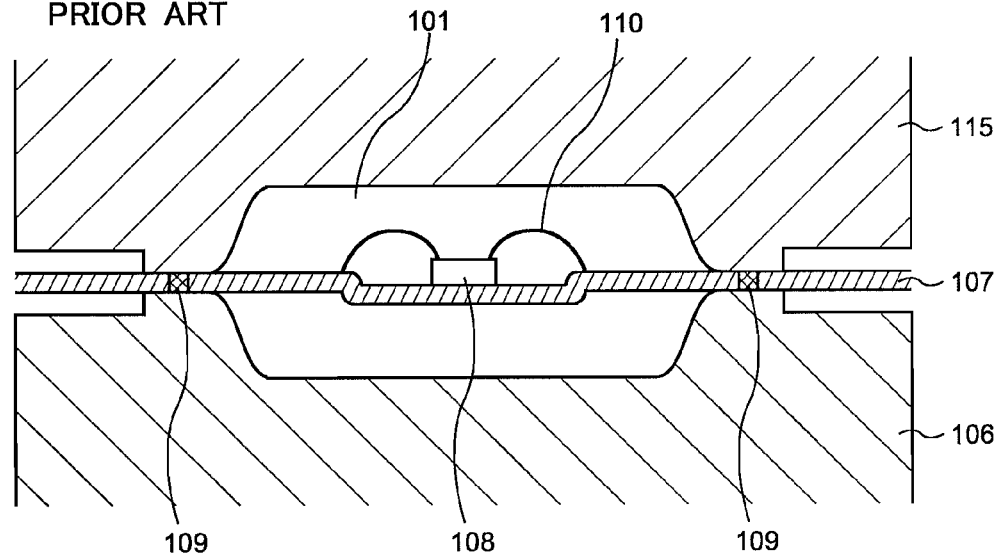
FIG. 5 is a cross-sectional view showing a state of resin-molding in a resin-molding process step.
Figure 6:
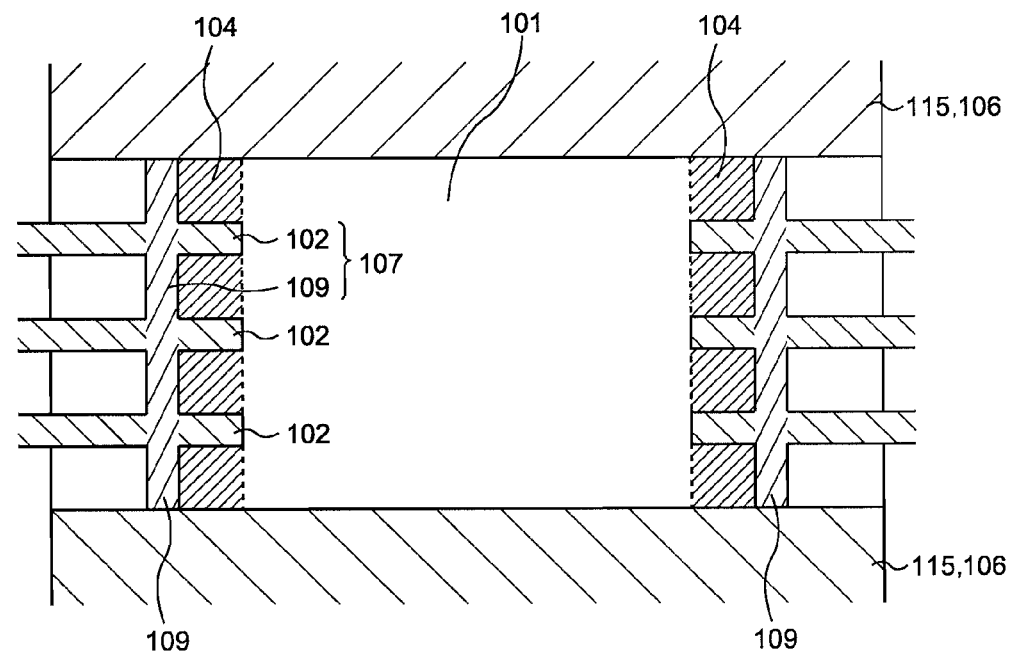
FIG. 6 is a perspective plan view looked from above an upper mold, showing a state in which dam bars prevent the resin injected into the resin molded device from flowing beyond an intended region.

Since the fine burrs on the lead frame 1 are turned into the flattened burrs 6 in the process step to apply the compressive pressure to the lead frame 1, the resin leakage portion 105 as shown in FIG. 4 is not formed on the surface of the outer lead 2 or the tie bar 3 clamped by the molds in the resin-molding process step as shown in FIG. 2A. Although an unnecessary resin film 4 is formed in a region surrounded by the resin package 5, the outer leads 2 and the tie bar 3, it can be removed by sandblasting or the like to prevent the problems from occurring as described above.

After that, tie bar 3 is cut and the outer leads 2 are folded as required to complete the desired resin molded semiconductor device.

Figure 2B:
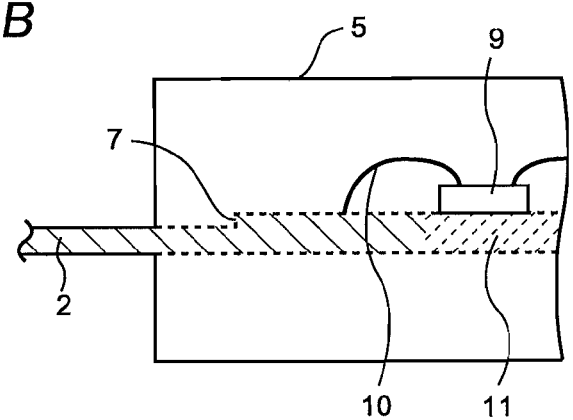
FIG. 2B is a cross-sectional view showing a section A-A in FIG. 2A.
Figure 3B:
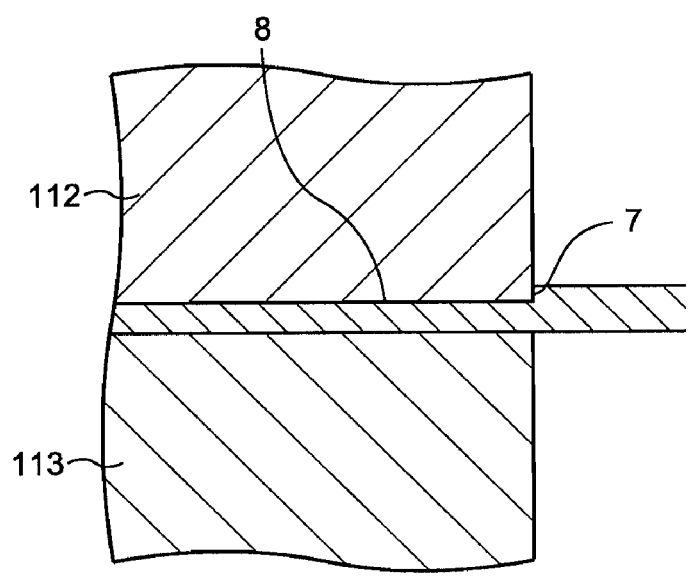

By introducing the process step to apply the compressive pressure to the lead frame 1, it is made possible to form a small step 7 on the lead frame 1 at a location interposed between and crushed by an upper plate 112 and a lower plate 113 as shown in FIG. 3B that is an enlarged view of a portion marked with a dashed line circle in FIG. 3A. As a result, a shallow dent 8 is formed in the lead frame 1 in a region pressed by the upper plate 112. The step 7 at one end of the dent 8 is sealed inside the resin package 5, as shown in FIG. 2B that is a cross-sectional view of a section A-A in FIG. 2A.

In the case of a semiconductor device of high electrical conductivity such as a power device, the lead frame 1 used in it is as thick as 0.5 mm, which makes the dent 8 relatively deep.

Thus the step 7 of the dent 8 inside the resin package 5 serves to anchor the lead frame 1 so that the outer lead 2 does not easily come off when an external force is applied to the outer lead 2, an island 11 or the like is prevented from being affected by the external force, and the semiconductor die 9, the bonding wire 10 and the like inside the resin package 5 are protected. However, since the lead frame 1 is as thin as around 0.2 mm in the case of a semiconductor device of medium electrical conductivity and having a small or medium number of pins, and a little thicker than 0.1 mm in the case of a semiconductor device having a large number of pins, introducing the process step to apply the compressive pressure forms on the pressed surface of the lead frame 1 the dent 8 that is not deep enough to serve as the anchor.

In this case, the lower plate 113 shown in FIG. 3A is provided with a dent while the upper plate 112 is provided with a projection that fits the dent in the lower plate 113. Then the lead frame 1 is placed on the lower plate 113 and firmly pressed by the upper plate 112 to form the dent 8 made of a step larger than the thickness of the lead frame 1 and small enough to be housed in the resin package 5 so that the dent 8 may serve as an anchor effectively. The dent 8 as described above may be formed in the case of the thick lead frame used in the semiconductor device of high electrical conductivity.

Although the SIP is described in the embodiment, this invention may be applied to other packages such as a QFP (Quad Flat Package) within the scope of the invention.

According to the embodiment of this invention, the resin leakage portion 105 is not formed on the surface of the outer lead 102 or the like in the resin-molding process step. As a result, there is no such case that the resin leakage portion 105 flakes off in subsequent process step such as folding the leads to make dust.

What is claimed is:

1. A method of manufacturing a resin molded semiconductor device, comprising:
   providing a lead frame comprising an island;
   bonding a semiconductor die on the island of the lead frame;
   electrically connecting the semiconductor die to the lead frame;
   resin-molding the lead frame on which the semiconductor die is bonded while clamping the lead frame with a mold so as to apply a clamping pressure to a region of the lead frame; and
   applying a compressive pressure to the region of the lead frame prior to the resin-molding, the compressive pressure being greater than the clamping pressure.

2. The method of claim 1, wherein the applying the compressive pressure forms a dent in the lead frame.

* * * * *